United States Patent [19]
Hoffelder

[11] Patent Number: 6,086,043
[45] Date of Patent: Jul. 11, 2000

[54] VALVE CONTROL APPARATUS WITH THREE-DIMENSIONAL CIRCUIT BOARD USING MID TECHNOLOGY

[75] Inventor: Bernd Hoffelder, Römerberg, Germany

[73] Assignee: Siemens Aktiengesellschaft, Munich, Germany

[21] Appl. No.: 09/269,689
[22] PCT Filed: Sep. 25, 1997
[86] PCT No.: PCT/DE97/02183
§ 371 Date: Mar. 30, 1999
§ 102(e) Date: Mar. 30, 1999
[87] PCT Pub. No.: WO98/14357
PCT Pub. Date: Apr. 9, 1998

[30] Foreign Application Priority Data

Sep. 30, 1996 [DE] Germany ............... 196 40 261

[51] Int. Cl.[7] .................................................. F16K 31/02
[52] U.S. Cl. ................ 251/129.15; 137/884; 303/119.2; 303/119.3
[58] Field of Search ................... 251/129.15; 137/119.3, 137/119.2; 303/119.3, 119.2

[56] References Cited

U.S. PATENT DOCUMENTS

| | | | |
|---|---|---|---|
| 5,482,362 | 1/1996 | Robinson | 303/119.2 |
| 5,950,661 | 9/1999 | Kirchhoff | 137/884 |
| 5,957,547 | 9/1999 | Schliebe et al. | 303/119.3 |
| 5,988,772 | 11/1999 | Hashida | 303/119.3 |
| 6,016,838 | 1/2000 | Wigmore | 137/884 |

FOREIGN PATENT DOCUMENTS

| | | |
|---|---|---|
| 3501711A1 | 10/1986 | Germany . |
| 0373551A | 6/1990 | Germany . |
| 4225358A1 | 2/1994 | Germany . |
| 4232205A1 | 3/1994 | Germany . |
| WO9521758A | 8/1995 | Germany . |

Primary Examiner—Kevin Shaver
Assistant Examiner—John P. Welsh
Attorney, Agent, or Firm—Hill & Simpson

[57] ABSTRACT

The plug parts and also the associated terminal pins are fashioned in one piece with the circuit board in MID technology, whereby of each of the two main surfaces of the circuit board at least one plug part respectively extends away perpendicularly. In addition, the terminals of each valve coil are fashioned as press-fit contacts, and the associated contact points of the circuit board are fashioned as through-holes that are metallized in MID technology.

5 Claims, 4 Drawing Sheets

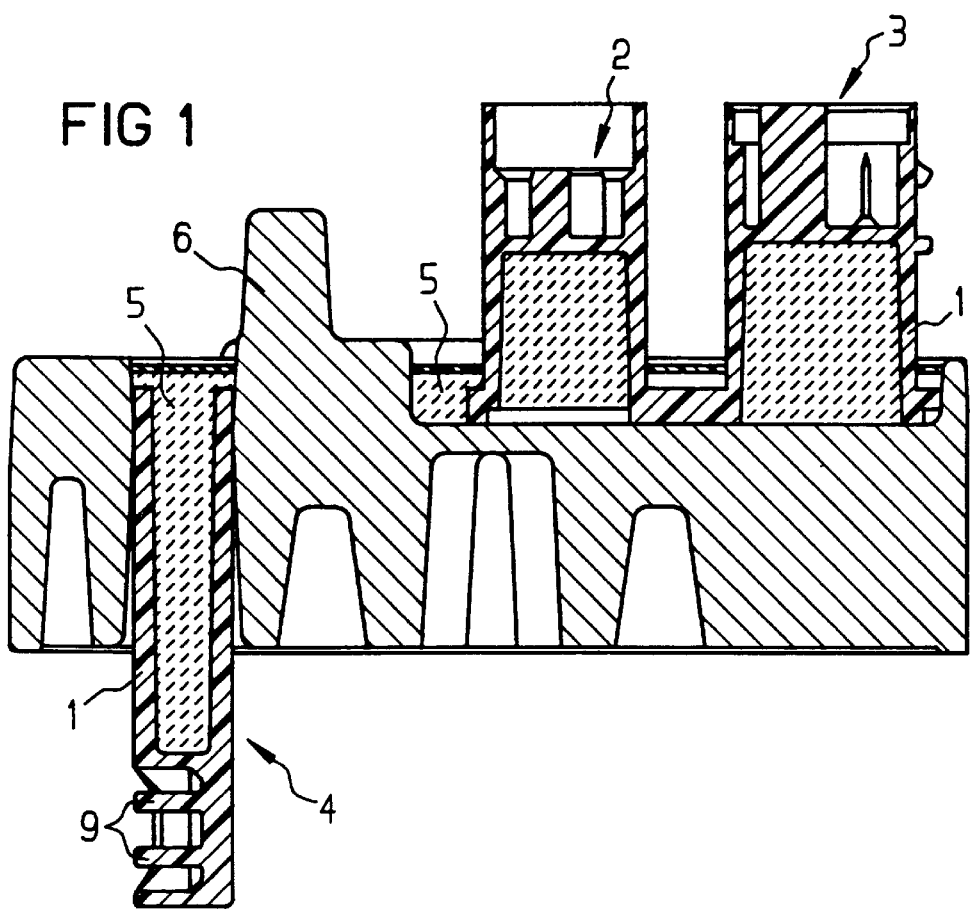
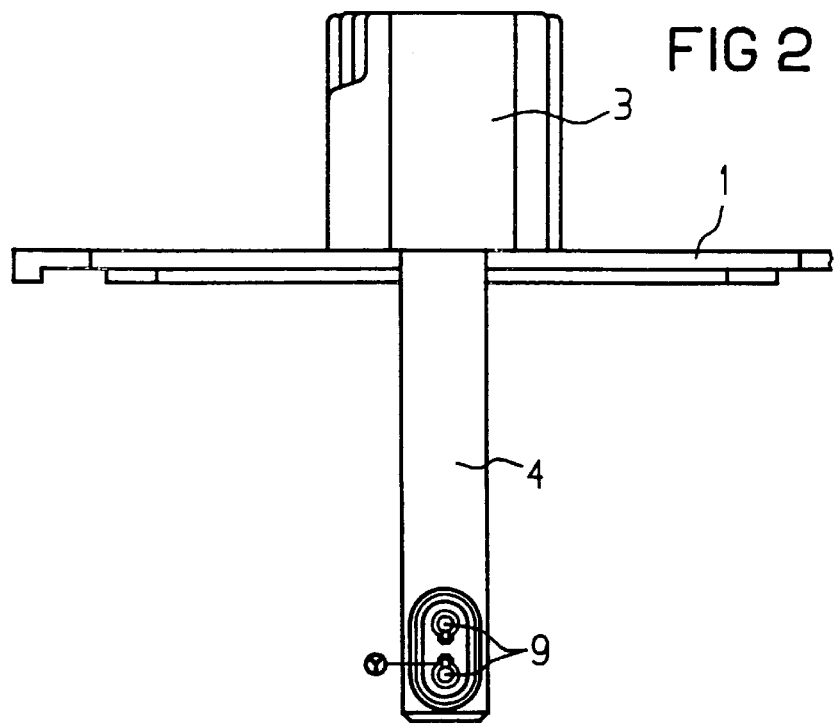

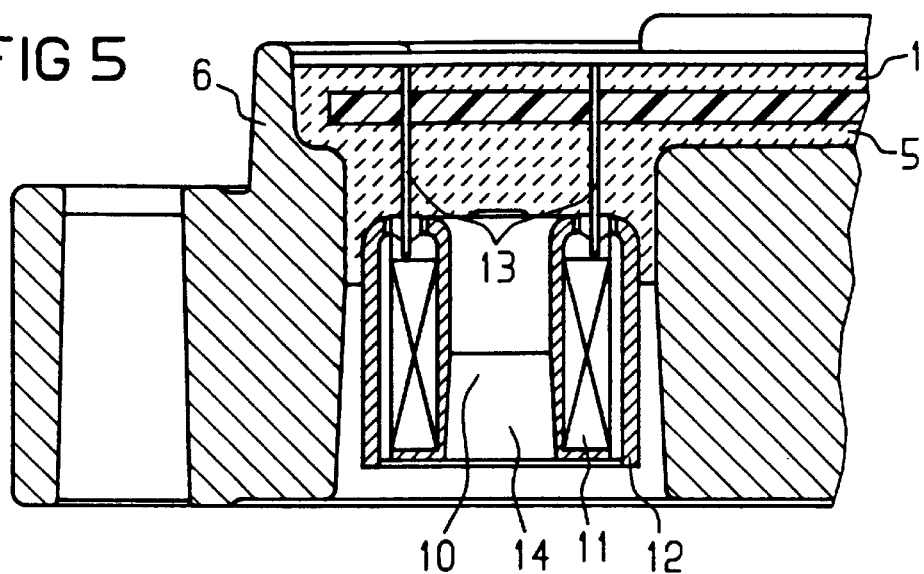
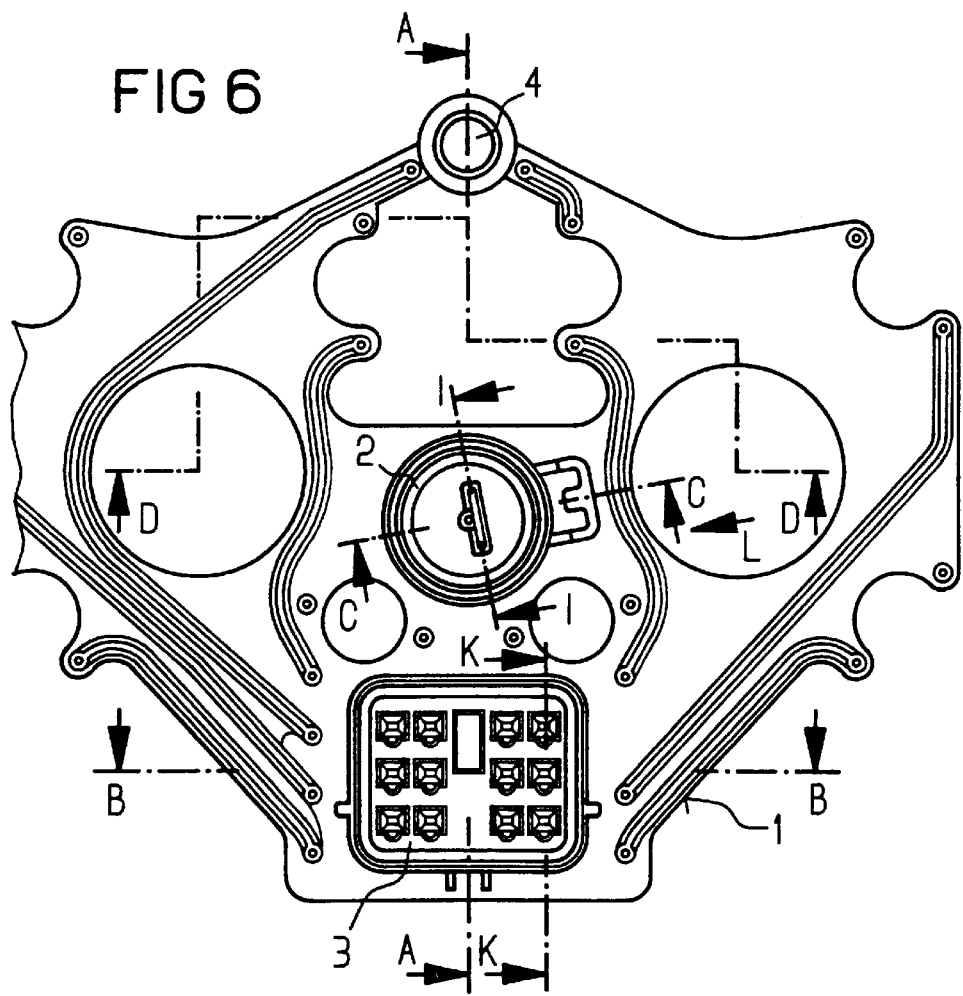

VALVE CONTROL APPARATUS WITH THREE-DIMENSIONAL CIRCUIT BOARD USING MID TECHNOLOGY

FIELD OF THE INVENTION

The invention relates to an apparatus for controlling electromagnetically actuated valves for a pressure fluid, having a housing in which at least one valve coil is arranged and is positioned by means of a fixing material, having at least two plug parts with terminal pins, and having a circuit bearer that is connected electrically with each valve coil and with each plug part.

BACKGROUND OF THE INVENTION

Such a valve control apparatus is for example known from DE 42 32 205 C2. The apparatus can be used in particular as a control apparatus for an anti-blocking system (ABS) in a motor vehicle in which the brake fluid that actuates the wheel brakes is controlled with two valves per wheel. The valves are each actuated by an electromagnet.

The ABS system known from the above-cited letters patent comprises a housing having a housing frame and a cover. In the interior of the housing a circuit bearer is arranged that is fastened on an aluminum base plate, e.g. by gluing. The housing frame comprises two plug parts manufactured together with it, of which the first is oriented perpendicular to a lateral surface and the second is oriented obliquely to the lower main surface of the housing frame. The plug pins, given by additional mechanical individual parts, are connected electrically with the circuit bearer in the assembly of the valve control apparatus, just as are the terminal wires of the valve coils, in that the plug pins and the terminal wires are plugged and soldered through bores of the circuit bearer.

The construction of the known apparatus is expensive, due to the complex spatial interplay of many different individual components (circuit boards, plug parts, plug pins, electronic components, valve coils) and due to the soldering processes. Due to its limitation to one plane, a conventional circuit bearer, e.g. a circuit board, is fundamentally not optimally suited for the essentially three-dimensional design of an ABS module. The use of a pressed screen (leadframe) made three-dimensional by corresponding shaping and subsequent bending leads no further, because from the manufacturing point of view this screen can be manufactured only at great expense.

On the other hand, today MIDs (Molded Interconnect Devices), i.e. three-dimensional circuit boards, provide a new technology with greater constructive freedom, especially spatially. A compound element is thereby produced from various plastics, mainly using two-shot injection-molding technique, of which one of the plastics must be metallizable and the other not. The switching layout is accordingly produced by means of the shaping of the injection-molding dies in such a way that the compound element receives a surface that can be selectively metallized (by means of etching and galvanization). However, this manufacturing technology also requires relatively high die costs, so that in general a reduced expense for the module to be produced results only if the number of components is actually considerably reduced. Above all, this is possible only with difficulty if components bound locally in the apparatus, here the valve coils and plug parts, are present that must also be located in the same place in the new solution in MID technology.

Therefore, there is a need for a valve control apparatus of the type named above that can be produced less expensively.

SUMMARY OF THE INVENTION

The above need is met by the present invention which provides a valve control apparatus of the type named above in that the circuit bearer is fashioned as a three-dimensional circuit board in MID technology, and in that the plug parts and also the associated terminal pins are fashioned in one piece with the circuit board in MID technology, whereby at least one plug part respectively extends away in perpendicular fashion from each of the two main surfaces of the circuit board, and in that the terminals of each valve coil are fashioned as press-fit contacts, and the associated contact points of the circuit board are fashioned as through-holes metallized in MID technology.

In an embodiment, the present invention provides an apparatus for controlling electromagnetically actuated valves for a pressurized fluid. The apparatus comprises a circuit board connected to at least one valve coil by a fixing material. The circuit board comprises at least two plug parts. Each plug part comprising a terminal pin. The circuit board is electrically connected to the valve coil and to each plug part. The circuit board, the plug parts and the terminal pins are molded together to form a three-dimensional structure. The circuit board comprises an upper surface and a lower surface and at least one of the plug parts extends upward from the upper surface of the circuit board while at least one of the plug parts extends downward from the lower surface of the circuit board. The valve coil comprises at least two terminals and the circuit board further comprises at least two metallized through-holes. Each terminal of the valve coil is press fit into one of the metallized holes of the circuit board.

In an embodiment, the metallized through holes of the circuit board are connected to interconnects. One of the interconnects extends along the upper surface of the circuit board while the other interconnect extends along the lower surface of the circuit board to help preclude short circuiting.

In an embodiment, the circuit board, plug parts and terminal pins are molded together using an MID process.

In an embodiment, the apparatus described above is manufactured according to a method wherein the circuit board, plug parts and terminal pins are molded together to form a three dimensional structure using an MID process.

Other objects and advantages of the present invention will become apparent from reading the following detailed description and appended claims, and upon reference to the accompanying drawings.

BRIEF DESCRIPTION OF THE DRAWING

An advantageous development of the invention results from the subclaim.

An embodiment of the invention is specified in more detail below with reference to the schematic drawing.

FIG. 1 is a sectional view of an assembled valve control apparatus made in accordance with the present invention, FIG. 2 is a side view of the three-dimensional circuit board for the apparatus shown in FIG. 1, FIG. 5 is a sectional view of one of the valve coils shown in FIG. 7, FIG. 6 is a top view of the circuit board shown in FIG. 2.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 3:
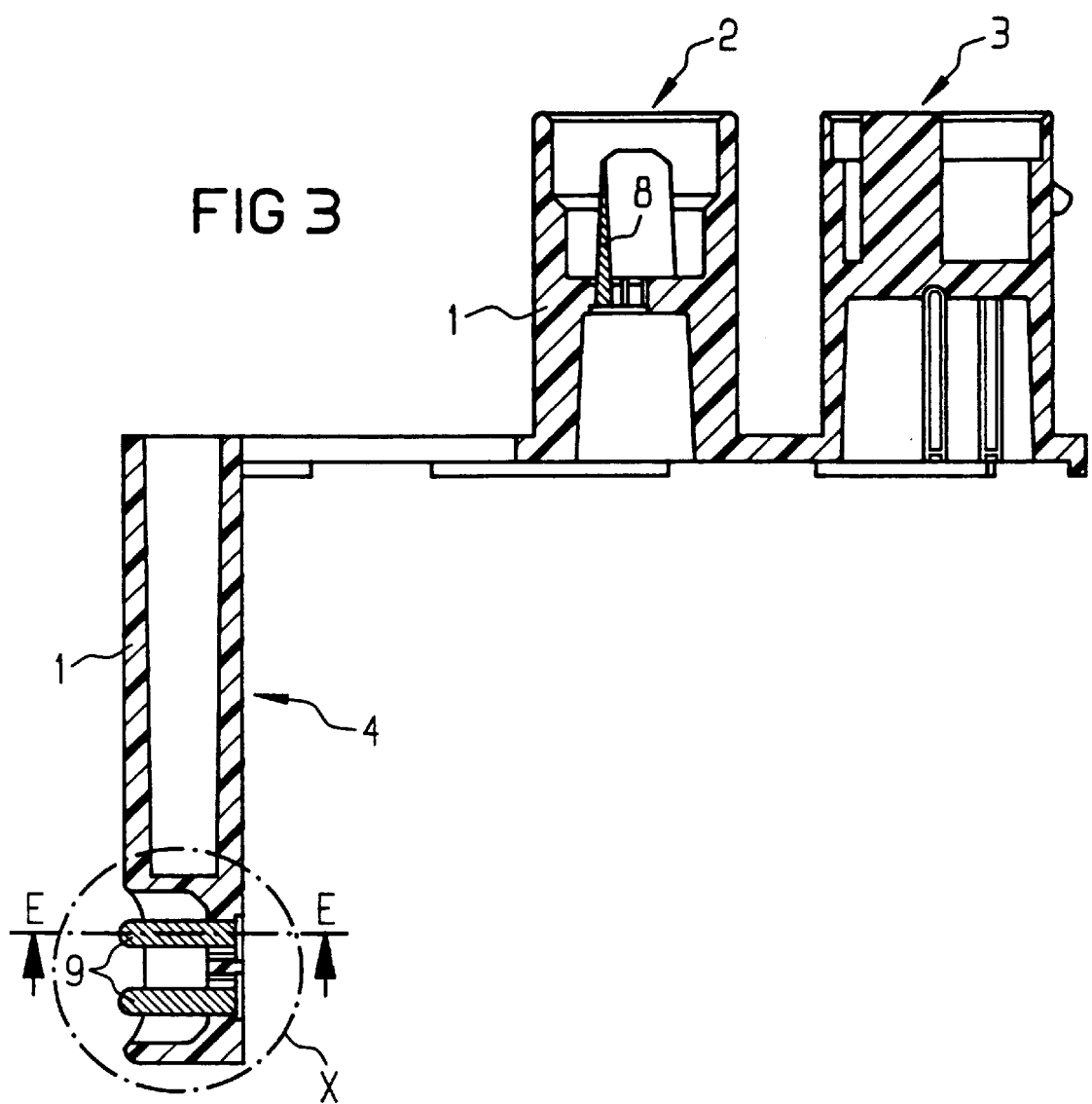
FIG. 3 is a sectional view of the circuit board shown in FIG. 2.
Figure 4:
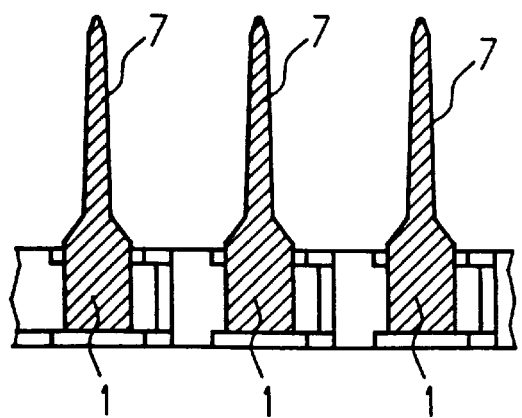
FIG. 4 is a partial sectional view of the apparatus shown in FIG. 2.

In FIG. 1, the MID circuit board 1 can be seen, on whose upper side a frame plug 2 and a twelve-pole plug 3 are integrated, and on whose lower side a third plug 4, extending relatively far downward, is integrated. The design and the geometry of the actual three-dimensional circuit board 1 are best seen in FIG. 2 or, respectively, 3. The plug pins 7, 8 and 9 of the three plugs shown, whereby the plug pins 7 of the plug 3 are shown separately in FIG. 4, are formed by means an injection-molding die and by means of the selective galvanic metallization of the integral component of the MID circuit board 1. Since the non-metallized parts predominate, it is advantageous to die-cast these parts in one step.

For the assembly of the valve control apparatus, the standard eight valve coils 10 per valve block, which respectively comprise a wound coil element 11 and a yoke ring 12 (cf. FIG. 5), are placed on a fastening means. A die-cast cover 6, made e.g. of aluminum, is placed on, the MID circuit board 1 is placed on the die-cast cover 6 and pressed downward, so that the press-fit terminals 13 of each valve coil 10 are pressed into the provided metallized through-holes of the circuit board 1. Subsequently, the apparatus is extrusion-coated with an elastic sealing compound 5, e.g. an elastomer, in order to achieve protection against environmental influences, in particular moisture. However, an adhesive can also for example be used as a fixing material. However, during the injection process a dome-type opening 14 is kept open in the valve coils 10, into which opening the armatures of the valves, which armatures are to be moved electromagnetically, are plugged. Finally, the valve control apparatus is provided in order to be plugged onto a valve block (not shown in the drawing) in which the actual valves are arranged. In the valve control apparatus, the valve coils 10 must be arranged corresponding to the geometry of this valve block.

Figure 7:
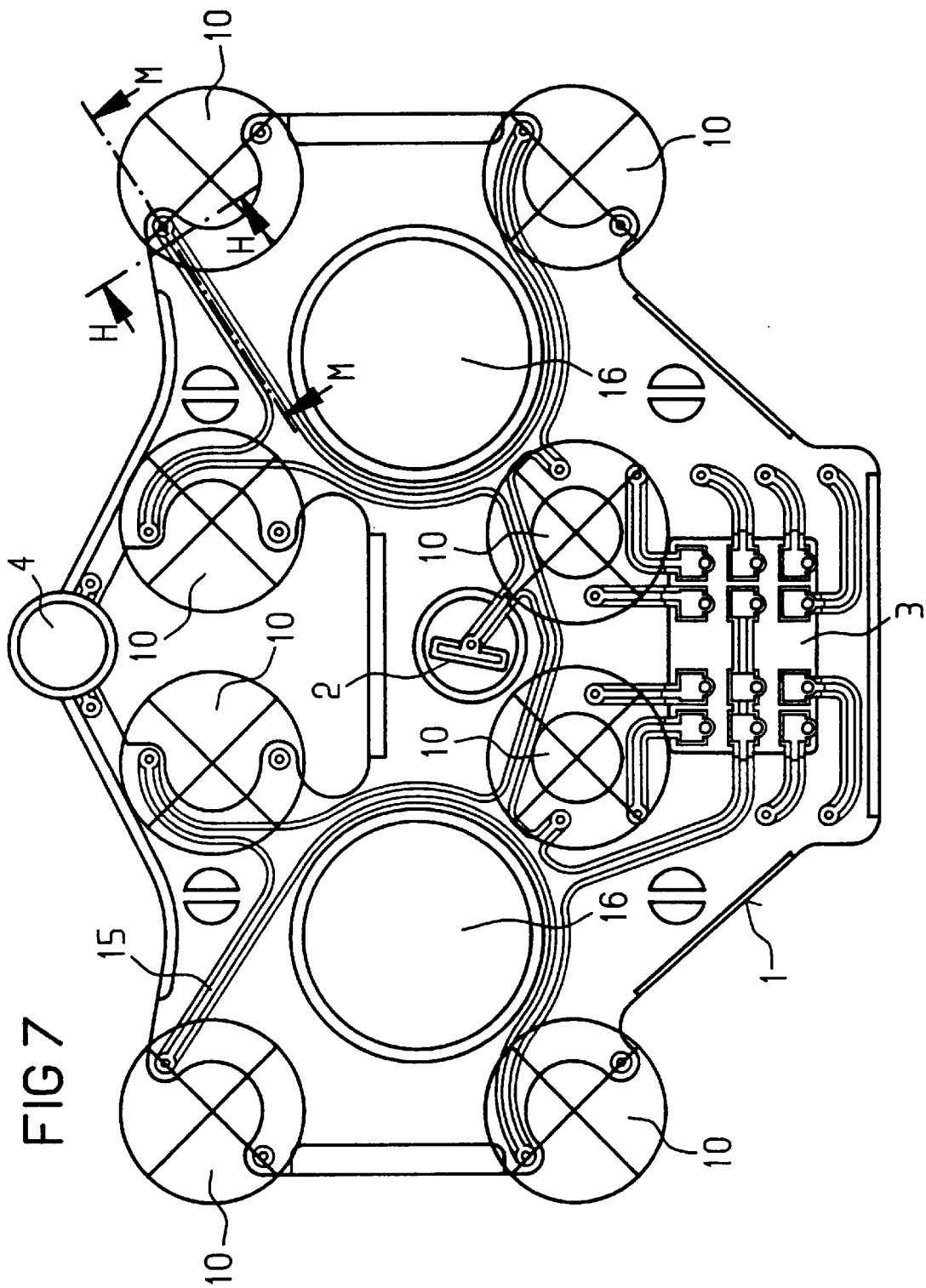
FIG. 7 is a bottom view of the circuit board shown in FIG. 2.

In FIGS. 6 and 7, it can be recognized that in all valve coils 10, of the interconnects 15 leading to the associated two metallized through-holes, one runs respectively on each main surface of the circuit board 1. This separation reduces the risk of short-circuiting. As can be seen in FIG. 7, the interconnects 15 are all connected with the frame plug 2 on the underside of the circuit board 1. Openings 16, in which parts of the die-cast cover 6 engage, can also be seen in FIG. 7.

The contacting of the plug pins 9 of the elongated plug 4, which pins are oriented parallel to the circuit board 1, also takes place in MID technology. In the interior of the plug 4, which in addition is also filled with sealing compound 5, the corresponding interconnects are routed downward up to the plug pins 9.

As plug pins, in particular for the twelve-pole plug 3, flat tongues, e.g. 0.63 mm thick, are die-cast from conductive plastic for what are called fasten plugs. For the press-fit contacting of the valve coils, the H-shaped pins known from communication technology, or press-fit pins with a different shape, are used. The press-fit contacts can, if warranted, also be additionally soldered for reasons of security.

By means of the integrated three-dimensional circuit board 1, in which the complete plugs are equally co-realized in the casting process, the three-dimensional pressed screen is omitted, the additional mechanical plug pins are omitted, and the various soldering processes of the terminals of the coils and plugs are omitted. The manufacturing expense is thereby as a whole reduced to about half of that required in conventional technology.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. An apparatus for controlling electromagnetically actuated valves for a pressurized fluid, the apparatus comprising:

a circuit board connected to at least one valve coil by a fixing material, the circuit board comprising at least two plug parts, each plug part comprising a terminal pin, the circuit board being electrically connected to the at least one valve coil and to each plug part, the circuit board, the plug parts and the terminal pins being molded together to form a three-dimensional structure, the circuit board comprising an upper surface and a lower surface, at least one of the plug parts extending upward from the upper surface of the circuit board and at least one of the plug parts extending downward from the lower surface of the circuit board, the at least one valve coil comprising at least two terminals, the circuit board further comprising at least two metallized through-holes, each terminal being press fit into one of the at least two metallized through-holes of the circuit board.

2. The apparatus of claim 1 wherein each of the metallized through-holes is connected to an interconnect, one of the interconnects extending along the upper surface of the circuit board, the other of the interconnects extending along the lower surface of the circuit board.

3. The apparatus of claim 1 wherein the circuit board, the plug parts and the terminal pins being molded together utilizing an MID process.

4. A method of manufacturing an apparatus for controlling electromagnetically actuated valves for a pressurized fluid, the apparatus including a circuit board connected to at least one valve coil by a fixing material, the circuit board comprising at least two plug parts, each plug part comprising a terminal pin, the circuit board being electrically connected to the at least one valve coil and to each plug part, the circuit board, the plug parts and the terminal pins being a unitary three-dimensional structure, the circuit board comprising an upper surface and a lower surface, at least one of the plug parts extending upward from the upper surface of the circuit board and at least one of the plug parts extending downward from the lower surface of the circuit board, the at least one valve coil comprising at least two terminals, the circuit board further comprising at least two metallized through-holes, each terminal being press fit into one of the at least two metallized through-holes of the circuit board, the method comprising the step of forming the circuit board, the plug parts and the terminal pins utilizing an MID process.

5. The method of claim 4 wherein each of the metallized through-holes is connected to an interconnect, one of the interconnects extending along the upper surface of the circuit board, the other of the interconnects extending along the lower surface of the circuit board.

* * * * *